United States Patent
Kondo et al.

(10) Patent No.: US 8,899,459 B2
(45) Date of Patent: Dec. 2, 2014

(54) BREAKING APPARATUS AND BREAKING METHOD FOR SUBSTRATE MADE OF BRITTLE MATERIAL

(75) Inventors: Noriyuki Kondo, Suita (JP); Ikuyoshi Nakatani, Suita (JP)

(73) Assignee: Mitsuboshi Diamond Industrial Co., Ltd., Suita, Osaka (JP)

( * ) Notice: Subject to any disclaimer, the term of this patent is extended or adjusted under 35 U.S.C. 154(b) by 890 days.

(21) Appl. No.: 13/094,249

(22) Filed: Apr. 26, 2011

(65) Prior Publication Data

US 2011/0266325 A1  Nov. 3, 2011

(30) Foreign Application Priority Data

Apr. 30, 2010  (JP) ................................. 2010-105372
Apr. 30, 2010  (JP) ................................. 2010-105373

(51) Int. Cl.
*B26F 3/00*  (2006.01)
*H01L 21/67*  (2006.01)
*B28D 5/00*  (2006.01)

(52) U.S. Cl.
CPC ........ *B28D 5/0011* (2013.01); *H01L 21/67092* (2013.01)
USPC .......................... 225/1; 225/93; 83/879; 83/72

(58) Field of Classification Search
USPC .............. 225/1–4, 93, 94, 95, 96, 98; 83/879, 83/880, 862–865, 72, 73, 74, 75, 75.5
See application file for complete search history.

(56) References Cited

U.S. PATENT DOCUMENTS

| | | | | |
|---|---|---|---|---|
| 4,948,025 A | * | 8/1990 | Lisec | 225/104 |
| 5,165,585 A | * | 11/1992 | Lisec | 225/2 |
| 5,267,168 A | * | 11/1993 | Antonissen et al. | 700/117 |
| 5,820,006 A | * | 10/1998 | Turner | 225/96 |
| 7,992,482 B2 | * | 8/2011 | Kim | 83/879 |
| 2009/0308219 A1 | * | 12/2009 | Yamamoto et al. | 83/880 |
| 2010/0059693 A1 | * | 3/2010 | Svidenko et al. | 250/492.3 |
| 2013/0292442 A1 | * | 11/2013 | Bayne et al. | 225/2 |

FOREIGN PATENT DOCUMENTS

| | | |
|---|---|---|
| JP | 2007-22848 | 2/2007 |
| JP | 2008-229716 | 10/2008 |
| JP | 2008-244222 A | 10/2008 |
| JP | 2009-172668 | 8/2009 |
| WO | 2007/024402 A2 | 3/2007 |

* cited by examiner

*Primary Examiner* — Phong Nguyen
(74) *Attorney, Agent, or Firm* — McGlew and Tuttle, P.C.

(57) ABSTRACT

In a breaking operation, a substrate is moved so that a blade can be situated in line with a scribe line, and the blade is lowered to break the substrate. After the breaking, the blade is raised. Then, the substrate is moved along its surface while taking an image of the substrate by using a camera after the breaking. Moreover, the blade is lowered to break the substrate. After the breaking, the blade is raised. Then, the substrate is moved along its surface while performing image processing concurrently. After the movement of the substrate, the position of the substrate is corrected so that the following scribe line to be cut for breaking can be situated immediately below the blade. In this way, the time required for breaking the substrate formed with a multiplicity of scribe lines into pieces can be shortened.

7 Claims, 17 Drawing Sheets

F I G. 4
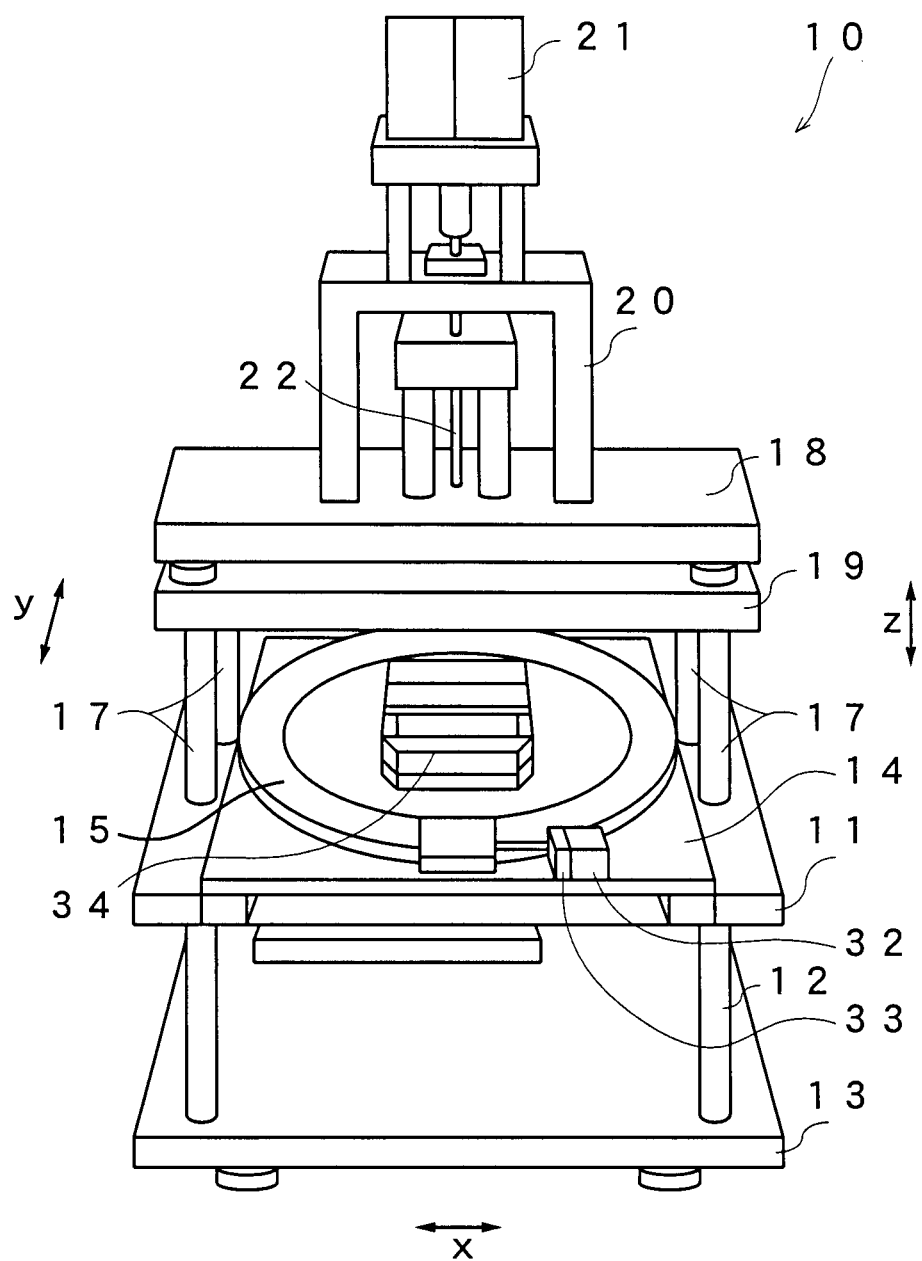

F I G. 6
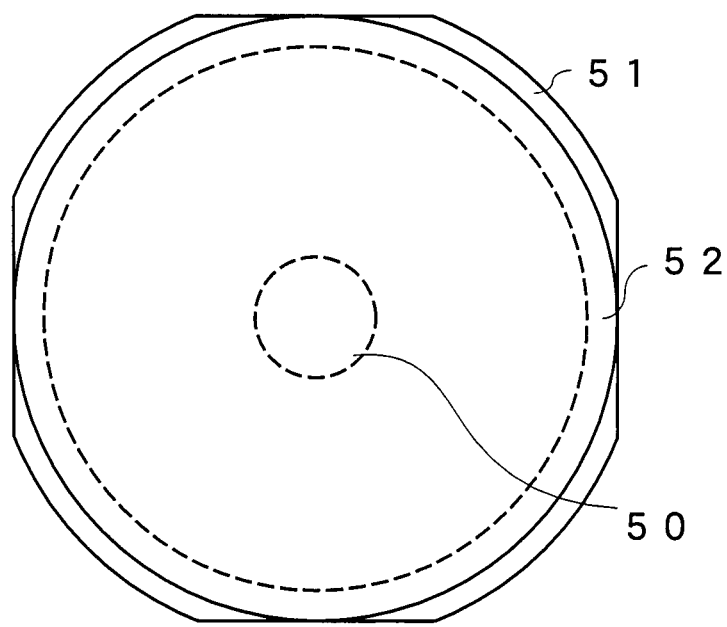

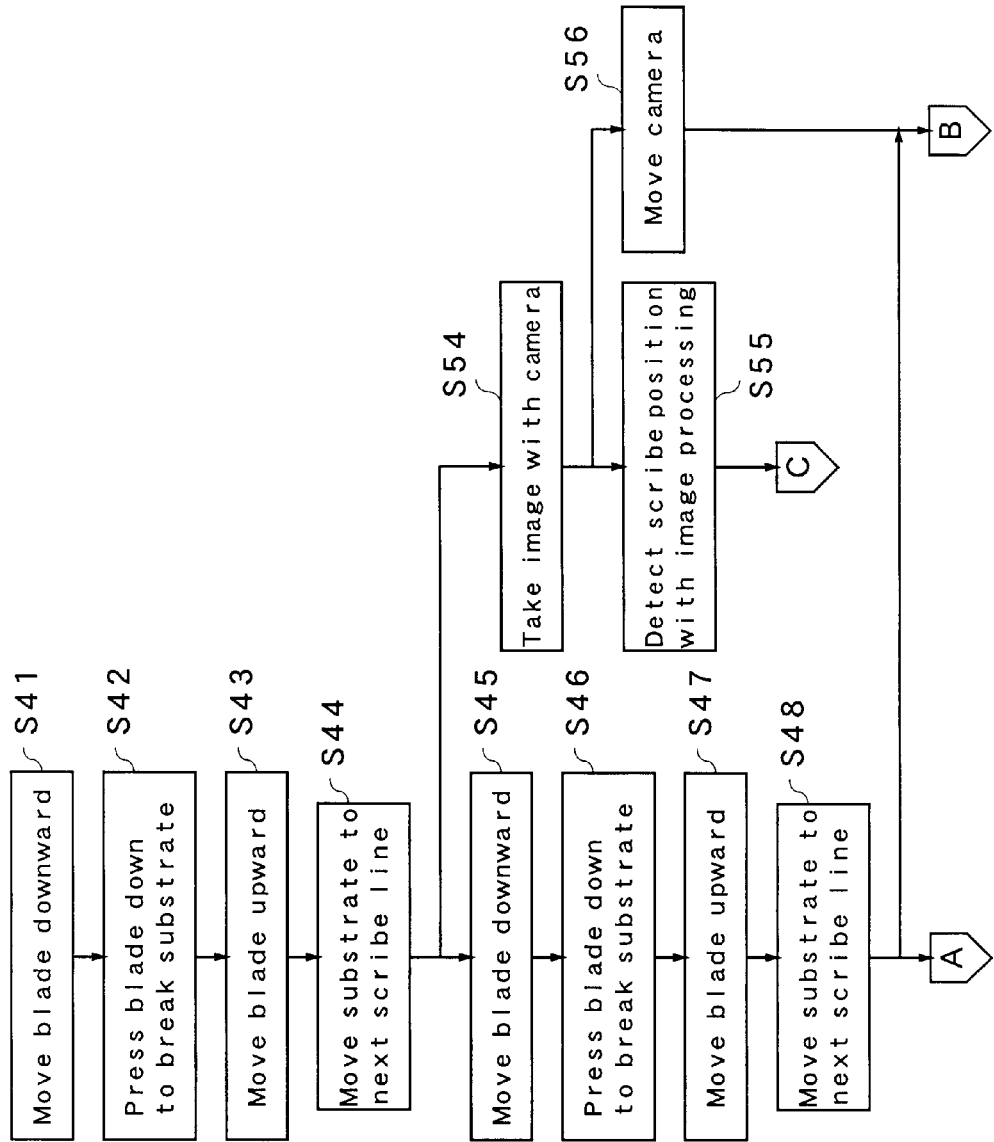

BREAKING APPARATUS AND BREAKING METHOD FOR SUBSTRATE MADE OF BRITTLE MATERIAL

BACKGROUND OF THE INVENTION

1. Field of the Invention

The present invention relates to a breaking apparatus and a breaking method for breaking a brittle material-made substrate formed with scribe lines along the scribe lines.

2. Discussion of the Related Art

In a conventional LED manufacturing process, LED chips are provided in a lattice arrangement on a circular sapphire substrate, and the substrate is scribed to form lines in a grid pattern (scribe lines) thereon for segmentation to obtain separate LED chips. The substrate is broken along the scribe lines. In Japanese Unexamined Patent Publication JP-A 2008-244222, there is disclosed a breaking apparatus designed for such an operation. FIG. 1 is a sectional view showing an example of how a substrate is to be broken. In FIG. 1, a substrate 101 has formed thereon a multiplicity of LED chips 102 arranged equidistantly, and an adhesive film 103 is bonded to the top of the substrate 101. Scribe lines 104 are formed equidistantly, each of which lies in a position midway between adjacent LED chips 102 on the substrate 101. The substrate 101 is placed on a sheet 105, and the sheet bearing the substrate 101 is further placed on a pair of blade rests 106. Above the substrate 101 is retained a blade 107 for free up-and-down, or vertical motion along a z axis, and under the substrate 101 is disposed a camera 108. In a breaking process, the scribe line 104 is positioned at the center of the paired blade rests 106, and the blade 107 is pressed down from directly above the scribe line 104 in the direction of the z axis to break the substrate along the scribe line 104.

FIG. 2 is a sequence diagram showing the steps of a breaking process. FIG. 3 is a time chart showing the positions of the blade in the z-axis direction, in which are also shown the step numbers described in FIG. 2. With the scribe line 104 set in a position immediately below the blade 107, breaking is started. To begin with, in step S1 of FIG. 2, the blade 107 is moved downward from a position of 0.00 mm. Even after the front end of the blade 107 is brought into contact with the adhesive film 103 on the top of the substrate, the blade 107 is further pressed down to a position of −0.30 mm while decreasing the speed of downward motion to break the substrate (step S2). After the completion of breaking, in step S3, the blade 107 is raised for return to its original position, namely the position of 0.00 mm. Subsequently, in step S4, the substrate 101 is moved in the direction of a y axis shown in FIG. 1 until the following scribe line is set in position. Given that the distance of travel of the substrate corresponds to the pitch of scribe lines drawn side by side, then the following scribe line is situated substantially immediately below the blade 107 after the travel. However, since the substrate undergoes a small amount of displacement because of the breaking process, it follows that the following scribe line is not exactly situated immediately below the blade 107. In view of this, after the travel, an image of the substrate 101 is taken from below by the camera 108 in a region between the blade rests 106 (step S5). Then, image processing is performed to detect the position of the following scribe line (step S6), and a minute correction is made to the position of the substrate 101 so that the scribe line can be situated immediately below the blade 107 in the y-axis direction (step S7). After the completion of the positional correction, the procedure returns to step S1 to repeat the same process steps.

Thus, according to the conventional breaking method, since the substrate undergoes a small amount of displacement when the blade makes contact with the substrate for breaking, it is necessary to make a fine adjustment of the position of the substrate every time breaking is carried out to correct the displacement. However, an image of the substrate is taken by the camera after the substrate is moved until the following scribe line to be cut for breaking is set in position, and also image processing is performed to detect the position of the scribe line. That is, much time is required for the process steps including the image processing with a consequent undesirable increase in breaking time. As another problem, if the angle of the substrate is deviated, it will be difficult to achieve angular correction adequately.

SUMMARY OF THE INVENTION

The present invention has been devised in view of the problems associated with the conventional art as mentioned supra, and an object of the present invention is to achieve a reduction in operation time by accomplishing image processing and substrate movement in a concurrent manner.

To solve the problems, a breaking method of the present invention for breaking a substrate formed with a plurality of scribe lines successively along the scribe lines by pressing a blade thereto, comprises the steps of: lowering a blade in line with a scribe line; pressing said blade down to break a substrate along the scribe line formed thereon; raising said blade while acquiring an image of the substrate with use of a camera; moving the substrate until the following scribe line to be cut for breaking is set in a breaking position, and, in parallel with the movement of said substrate, detecting the position of the following scribe line to be cut for breaking by performing image processing on said image taken by the camera; and correcting the position of said substrate so that the following scribe line to be cut for breaking can be situated immediately below said blade after the movement of said substrate.

To solve the problems, a breaking apparatus of the present invention for breaking a substrate formed with a plurality of scribe lines successively along the scribe lines, comprises: a blade raising-lowering unit for moving a blade in upward and downward directions to break a substrate; a blade rest for holding a substrate formed with a plurality of scribe lines; a moving unit for moving said substrate along its surface; a camera for taking an image of part of the substrate located between said blade rest; and a controller for allowing said blade to move upward after breaking for acquisition of a substrate image using the camera, allowing the substrate to move until the following scribe line to be cut for breaking is set in a breaking position, allowing detection of the position of the following scribe line to be cut for breaking through image processing on said image taken by the camera concurrently with the movement of said substrate, and allowing correction of the position of said substrate so that the following scribe line to be cut for breaking can be situated immediately below said blade.

To solve the problems, a breaking method of the present invention for breaking a substrate formed with a plurality of scribe lines successively along the scribe lines by pressing a blade thereto, comprises the steps of: a first breaking process of lowering and raising a blade in line with a scribe line to break a substrate along the scribe line, and moving said substrate so that the following scribe line to be cut for breaking can be situated immediately below said blade; a second breaking process of lowering and raising the blade in line with the scribe line to break the substrate along the scribe line, and moving said substrate so that the following scribe line to be cut for breaking can be situated immediately below said blade; a process of, after the completion of said first breaking process, acquiring an image of the substrate with use of a camera and performing image processing to detect the position of the following scribe line to be cut for breaking concurrently with said second breaking process; and a process of, after the completion of said second breaking process, correcting the position of said substrate so that the following scribe line to be cut for breaking can be situated immediately below said blade, whereafter returning the procedure to said second breaking process.

To solve the problems, a breaking apparatus of the present invention for breaking a substrate formed with a plurality of scribe lines successively along the scribe lines, comprises: a blade raising-lowering unit for moving a blade in upward and downward directions to break a substrate; a blade rest for holding a substrate formed with a plurality of scribe lines; a moving unit for moving said substrate along its surface; a camera for taking an image of part of the substrate located between said blade rest; and a controller for performing a first breaking process of lowering and raising a blade in line with a scribe line to break a substrate along the scribe line, and moving said substrate so that the following scribe line to be cut for breaking can be situated immediately below said blade, a second breaking process of lowering and raising the blade in line with the scribe line to break the substrate along the scribe line, and moving said substrate so that the following scribe line to be cut for breaking can be situated immediately below said blade; a process of, after the completion of said first breaking process, acquiring an image of the substrate with use of a camera and performing image processing to detect the position of the following scribe line to be cut for breaking concurrently with said second breaking process; and a process of, after the completion of said second breaking process, correcting the position of said substrate so that the following scribe line to be cut for breaking can be situated immediately below said blade.

The breaking apparatus may further comprises: an illuminating device for illuminating the substrate at the time of image acquisition using said camera.

In the breaking apparatus, said illuminating device may comprise a light source for emitting light of single color.

In the breaking apparatus, said illuminating device may be configured to apply light to the substrate by means of one of transmission-mode illumination and reflection-mode illumination.

In the breaking apparatus, said illuminating device may employ one of a bright-field illumination technique for effecting illumination in coaxial relation to image-taking action of the camera and a dark-field illumination technique for effecting illumination in non coaxial relation thereto.

To solve the problems, a breaking method of the present invention for breaking a substrate formed with a plurality of scribe lines successively along the scribe lines by pressing a blade thereto, comprises the steps of: a first breaking process of lowering and raising a blade in line with a scribe line to break a substrate along the scribe line, and moving said substrate so that the following scribe line to be cut for breaking can be situated immediately below said blade; a second breaking process of lowering and raising the blade in line with the scribe line to break the substrate along the scribe line, and moving said substrate so that the following scribe line to be cut for breaking can be situated immediately below said blade; a third breaking process of lowering and raising the blade in line with the scribe line to break the substrate along the scribe line, and moving said substrate so that the following scribe line to be cut for breaking can be situated immediately below said blade; a first image processing for, after the completion of said first breaking process, acquiring an image of the substrate with use of a camera to detect the position of the following scribe line to be cut for breaking concurrently with said second breaking process; a second image processing for, after the completion of said second breaking process, acquiring an image of the substrate with use of the camera in a different position to detect the position of the following scribe line to be cut for breaking concurrently with said third breaking process; and a process of, after the completion of said third breaking process, correcting the position of said substrate so that the following scribe line to be cut for breaking can be situated immediately below said blade on the basis of the position detected by said first image processing and second image processing, whereafter returning the procedure to said second breaking process.

In the breaking method, said first, second and third breaking processes may comprise: a step of lowering the blade in line with a scribe line, a step of pressing said blade down to break the substrate along the scribe line formed thereon, a step of raising said blade, and a step of moving the substrate until the following scribe line to be cut for breaking is set in a breaking position.

To solve the problems, a breaking apparatus for breaking a substrate formed with a plurality of scribe lines successively along the scribe lines, comprises: a blade raising-lowering unit for moving a blade in upward and downward directions to break a substrate; a blade rest for holding a substrate formed with a plurality of scribe lines; a moving unit for moving and rotating said substrate along its surface; a camera for taking an image of part of the substrate located between said blade rest; and a controller for performing a first breaking process of lowering and raising a blade in line with a scribe line to break a substrate along the scribe line, and moving said substrate so that the following scribe line to be cut for breaking can be situated immediately below said blade; a second breaking process of lowering and raising the blade in line with the scribe line to break the substrate along the scribe line, and moving said substrate so that the following scribe line to be cut for breaking can be situated immediately below said blade; a third breaking process of lowering and raising the blade in line with the scribe line to break the substrate along the scribe line, and moving said substrate so that the following scribe line to be cut for breaking can be situated immediately below said blade; a first image processing for, after the completion of said first breaking process, acquiring an image of the substrate with use of a camera to detect the position of the following scribe line to be cut for breaking concurrently with said second breaking process; a second image processing for, after the completion of said second breaking process, acquiring an image of the substrate with use of the camera in a different position to detect the position of the following scribe line to be cut for breaking concurrently with said third breaking process; and a process of, after the completion of said third breaking process, correcting the position of said substrate so that the following scribe line to be cut for breaking can be situated immediately below said blade on the basis of the position detected by said first image processing and second image processing.

According to the present invention having such a feature, after a substrate image is obtained, during the interval when the substrate is being moved until the following scribe line makes its approach to a target position, image processing is performed concurrently to detect the position of the following scribe line. This makes it possible to achieve correction for the scribe line position and angle of the substrate while shortening the time required for the entire breaking process, and thus attain the advantage that the substrate can be broken with precision.

BRIEF DESCRIPTION OF THE DRAWINGS

FIG. 4 is a perspective view showing the structure of a breaking apparatus in accordance with each embodiment of the present invention;

FIG. 6 is a plan view showing a ring member for the placement of a substrate in the breaking apparatus;

FIG. 14A is a sequence diagram showing the procedural steps of a breaking process in accordance with the third embodiment of the present invention (the first sequence);

DESCRIPTION OF THE PREFERRED EMBODIMENTS

Figure 1:
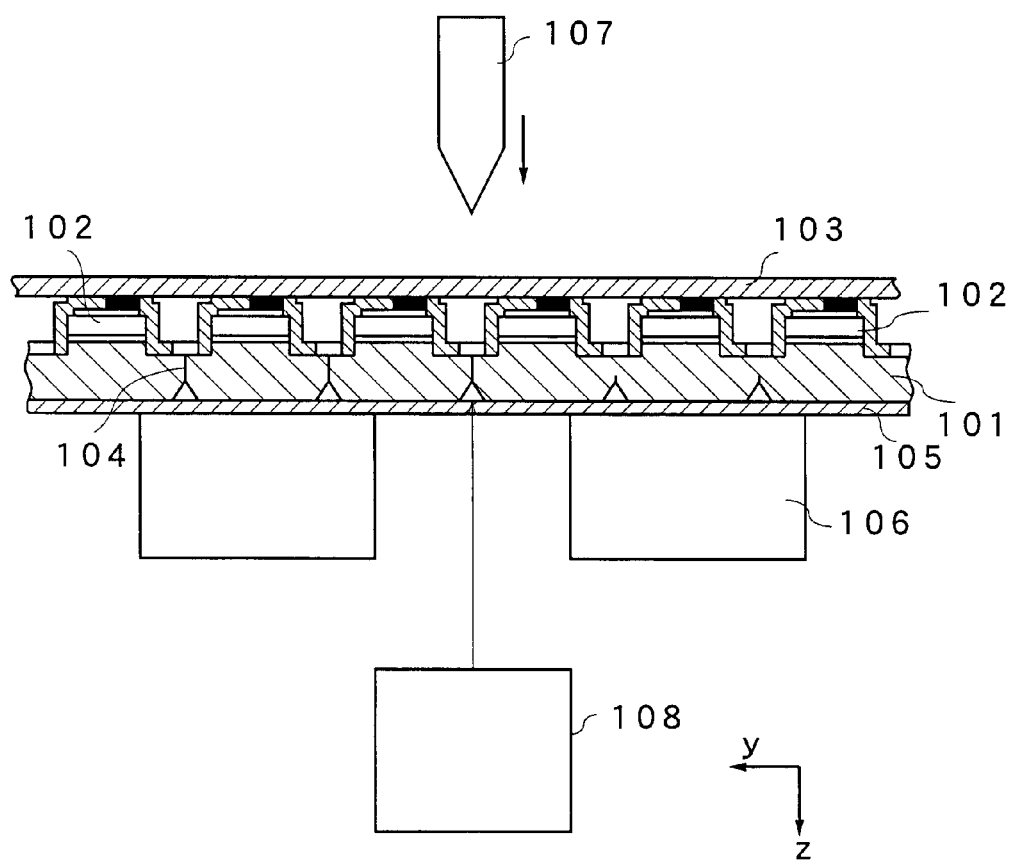
FIG. 1 is a view showing a condition of breaking performed by a breaking apparatus of conventional design.
Figure 2:
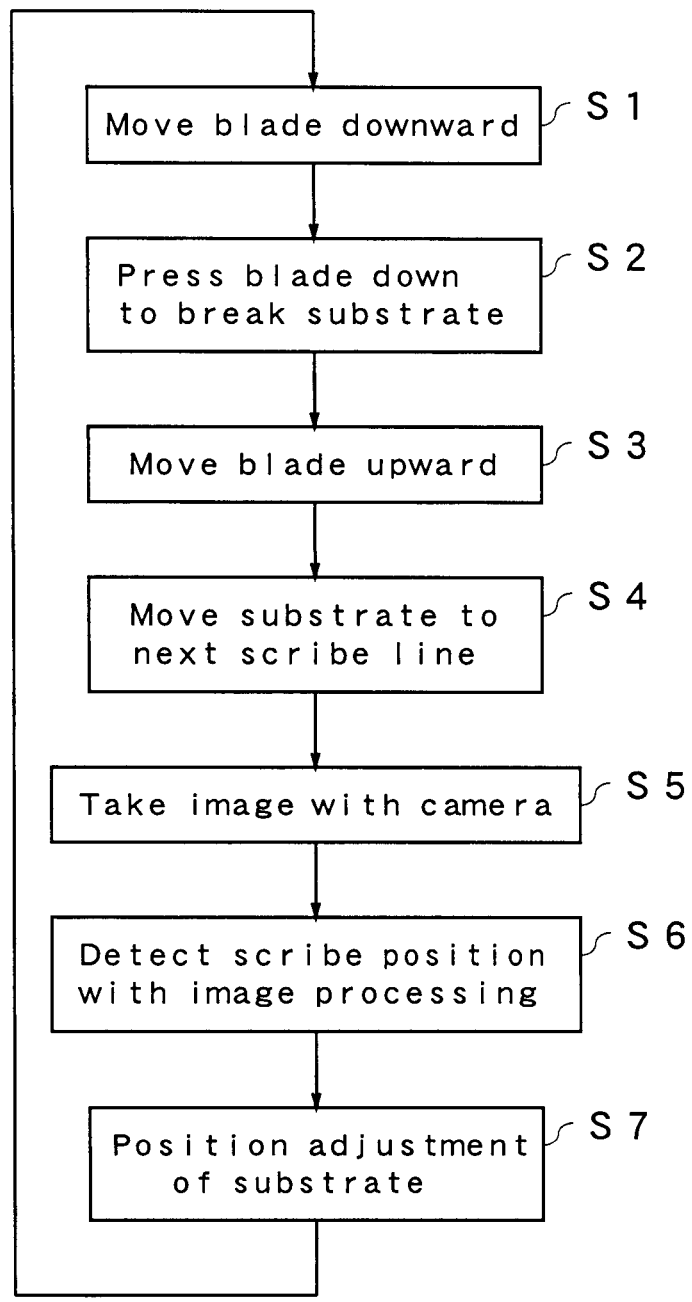
FIG. 2 is a sequence diagram showing the procedural steps of a conventional breaking process.
Figure 3:
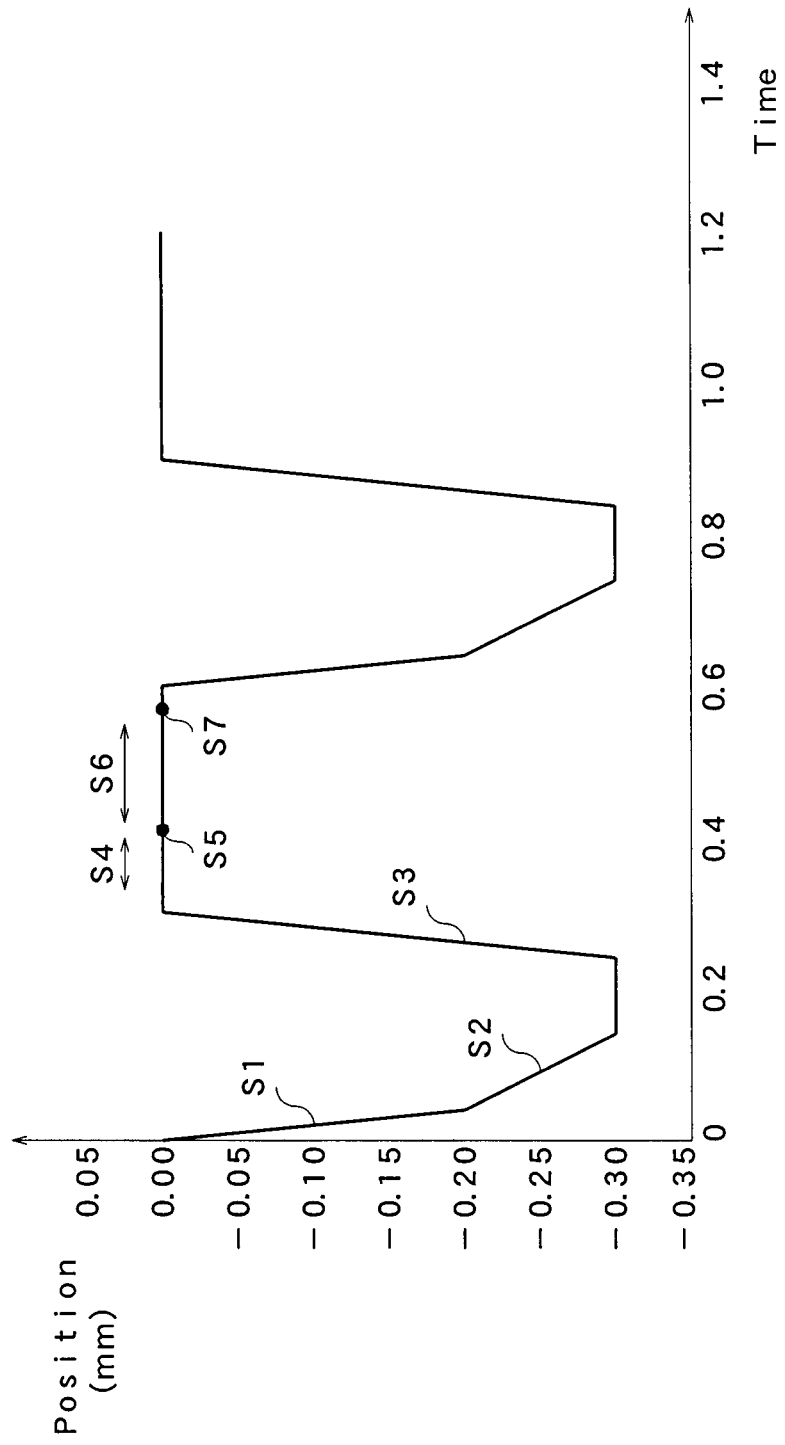
FIG. 3 is a time chart showing the positions of a blade in the conventional breaking process.
Figure 5:
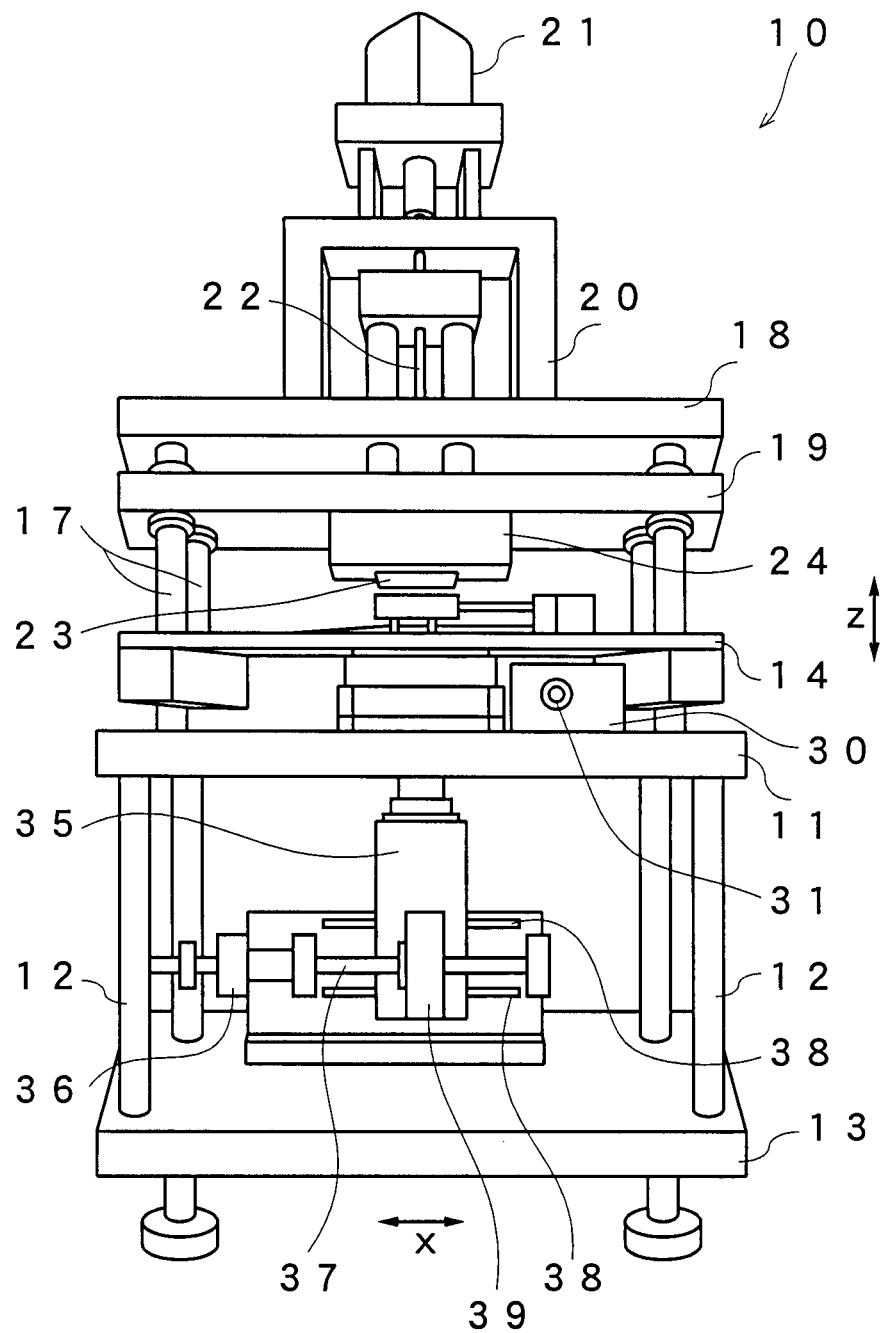
FIG. 5 is a perspective view of the structure of the breaking apparatus in accordance with each embodiment of the present invention, as seen in a different direction.

FIGS. 4 and 5 are perspective views showing a breaking apparatus for breaking a substrate made of a brittle material in accordance with an embodiment of the present invention, as viewed in different directions. In these figures, a breaking apparatus 10 is comprised of a support table 11 which is supported on four columns 12 on a base 13. The support table 11 supports a Y table 14, and a turning table 15 is disposed on the Y table 14. The Y table 14 is a table for moving the turning table 15 in the direction of a y axis, and the turning table 15 is a table for turning a substrate which will hereafter be described. On the upper surface of the support table 11, in addition to the turning table 15, four cylindrical raising-lowering guides 17 are formed in an upstanding state. A rack 18 is put, in hanging fashion, on the upper ends of the raising-lowering guides 17. Between the support table 11 and the rack 18 is disposed an up-and-down table 19 which is guided only in the direction of a z axis by the raising-lowering guides 17.

On the rack 18 is disposed a stepper motor 21, with a support member 20 lying between them. The rotary shaft of the stepper motor 21 is coupled with a ball screw 22 passing through the rack 18 for free relative rotation. The ball screw 22 is threadably mounted on the up-and-down table 19. Thus, the up-and-down table 19 is allowed to move up and down in the z-axis direction by the actuation of the stepper motor 21. On the under surface of the up-and-down table 19 is mounted a blade 23 for segmenting a substrate into pieces by application of pressure in a breaking process, with a support member 24 lying between them.

On the support table 11 are disposed a stepper motor 30 and a ball screw 31 which is rotated by driving the stepper motor 30. With the actuation of the ball screw 31, the Y table 14 is moved in the y-axis direction. A motor 32 and a turning mechanism 33 act to turn the turning table 15.

Figure 7:
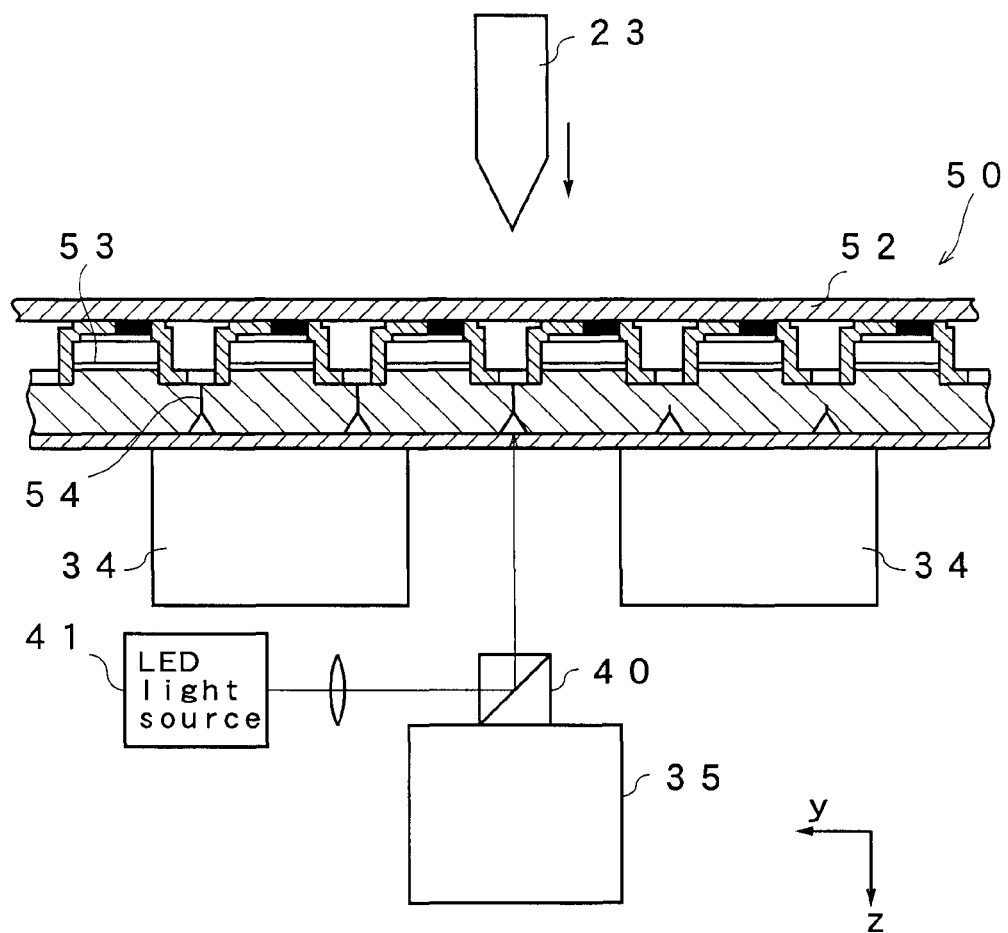
FIG. 7 is a view showing a condition of breaking performed by the breaking apparatus in accordance with each embodiment of the present invention.

FIG. 6 shows a sapphire substrate which is held on the turning table 15. In FIG. 6, an adhesive film 52 is laid over an annular ring member 51, and a circular substrate 50 is bonded to a central area of the adhesive film 52. As shown in FIG. 7, a multiplicity of chips 53 (such as LED chips) are provided in a lattice arrangement in advance on the substrate 50, and scribe lines 54 are formed in a grid pattern in advance on the under surface of the substrate so that adjacent LED chips can be separated one from the other.

On the support table 11 is disposed a blade rest 34 for holding the substrate 50 attached to the ring member 51. As shown in FIG. 7, the blade rest 34 is constructed of a pair of base members. That part of the support table 11 which faces a region between the paired blade rests 34 is made as an opening.

Meanwhile, as shown in FIG. 5, a camera 35 is placed under the support table 11. For example, the camera 35 is a CCD camera, and it is used to take an image of the substrate 50 retained on the top of the blade rest 34 through the opening as well as the region between the blade rest 34 on the support table 11. By taking an image of the substrate 50, the positions of the scribe lines or chips formed on the substrate 50 can be detected. On the basis of the result of detection, fine adjustment can be made to the position of the substrate 50.

Moreover, under the support table 11 is disposed a moving mechanism for moving the camera 35 in the direction of an x axis. As shown in FIG. 5, the moving mechanism has a stepper motor 36 and a ball screw 37 coupled to the shaft of the stepper motor 36. In the moving mechanism, a camera support portion 39 is moved along a guide rail 38 in the x-axis direction, thereby moving the camera 35 on the camera support portion 39 all together.

Further, as shown in FIG. 7, a half mirror 40 is disposed at the top of the camera 35, and a LED light source 41 is disposed alongside of the half mirror 40. As the LED light source 41, it is desirable to use a single light source that allows production of images of high contrast and high resolution, for example, a blue light source.

The raising-lowering guide 17, the rack 18, the up-and-down table 19, the support member 24, the stepper motor 30, and the ball screw 31 constitute a blade raising-lowering unit for moving the blade 23 up and down in the z-axis direction. Moreover, the Y table 14, the turning table 15, and a driving mechanism therefor constitute a moving unit for moving the substrate 50 placed on the blade rest 34 along its surface. In addition, the stepper motor 36, the ball screw 37, and the guide rail 38 constitute a camera moving unit for moving the camera 35 in the x-axis direction.

Figure 8:
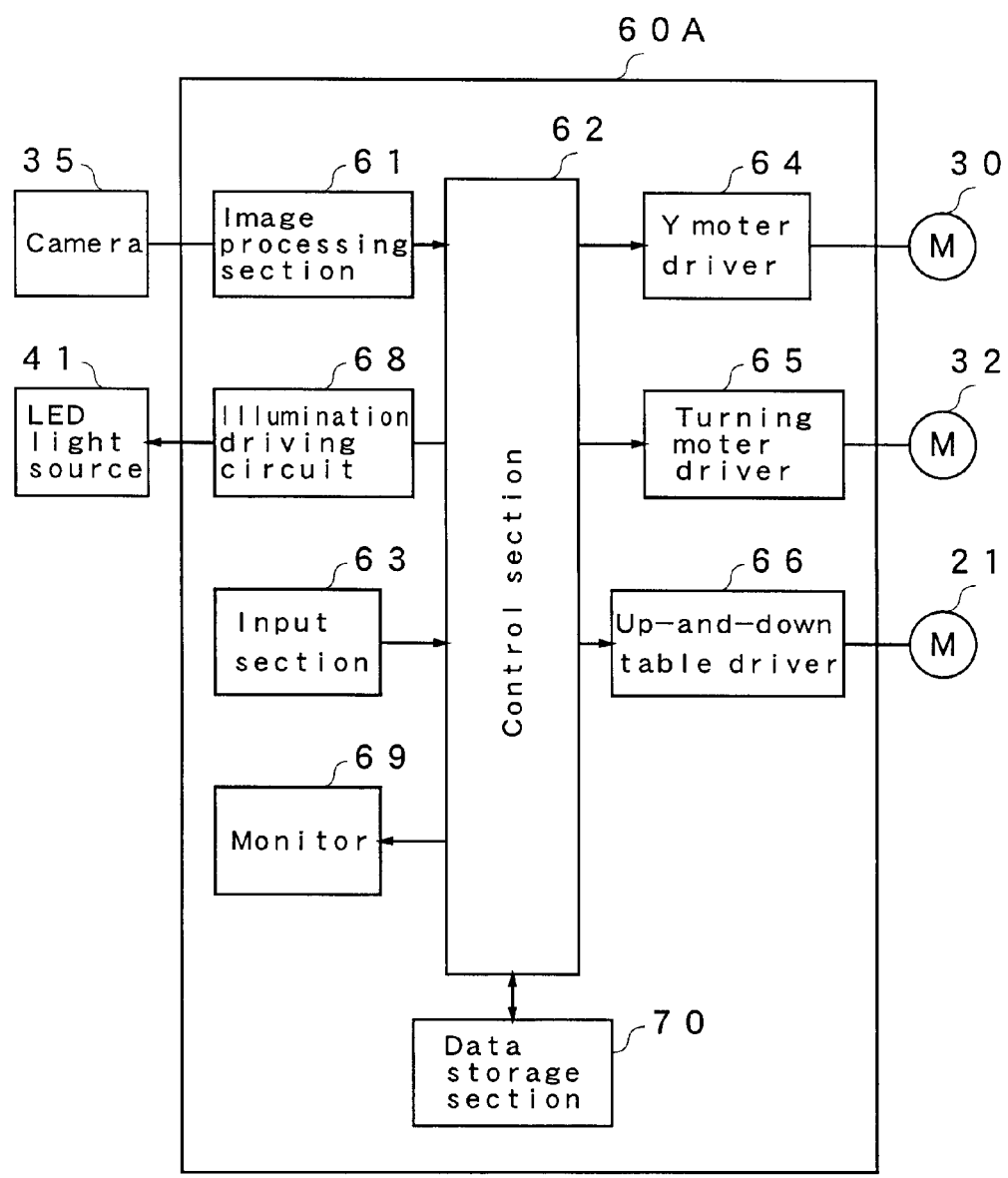
FIG. 8 is a block diagram of a controller in accordance with a first embodiment of the present invention.

Next, a controller of the breaking apparatus in accordance with a first embodiment of the present invention will be described. FIG. 8 is a block diagram showing the configuration of a controller 60A of the breaking apparatus. In the figure, an output from the camera 35 is fed, through an image processing section 61 of the controller 60A, to a control section 62. An input section 63 is provided for input of a reference pitch for a brittle material-made substrate. The control section 62 is connected with a Y motor driver 64, a turning motor driver 65, and an up-and-down table driver 66. The Y motor driver 64 drives the stepper motor 30. The turning motor driver 65 drives the motor 32. On the basis of data such as the pitch of scribe lines, the control section 62 controls the position of the Y table 14 in the y-axis direction and exercises rotation control over the turning table 15. Moreover, the control section 62 effects control of the up-and-down table driver 66 in a manner to adjust the operation of the stepper motor 21. In this way, the up-and-down table 19 is allowed to move up and down in the z-axis direction. Upon the downward movement of the up-and-down table 19, the blade 23 is brought into contact with a scribe line of the substrate 50 under pressure. Further, the control section 62 is provided with an illumination driving circuit 68 to which is connected the LED light source 41. The illumination driving circuit 68 drives the LED light source 41 in accordance with a predetermined operation timing, whereby the LED light source 41 can be used as a light source for the camera 35. The illumination driving circuit 68 constitutes an illuminating device in conjunction with the LED light source 41. In addition, the control section 62 is connected with a monitor 69 and a data storage section 70. The data storage section 70 stores therein data including the number of scribe lines.

Figure 9:
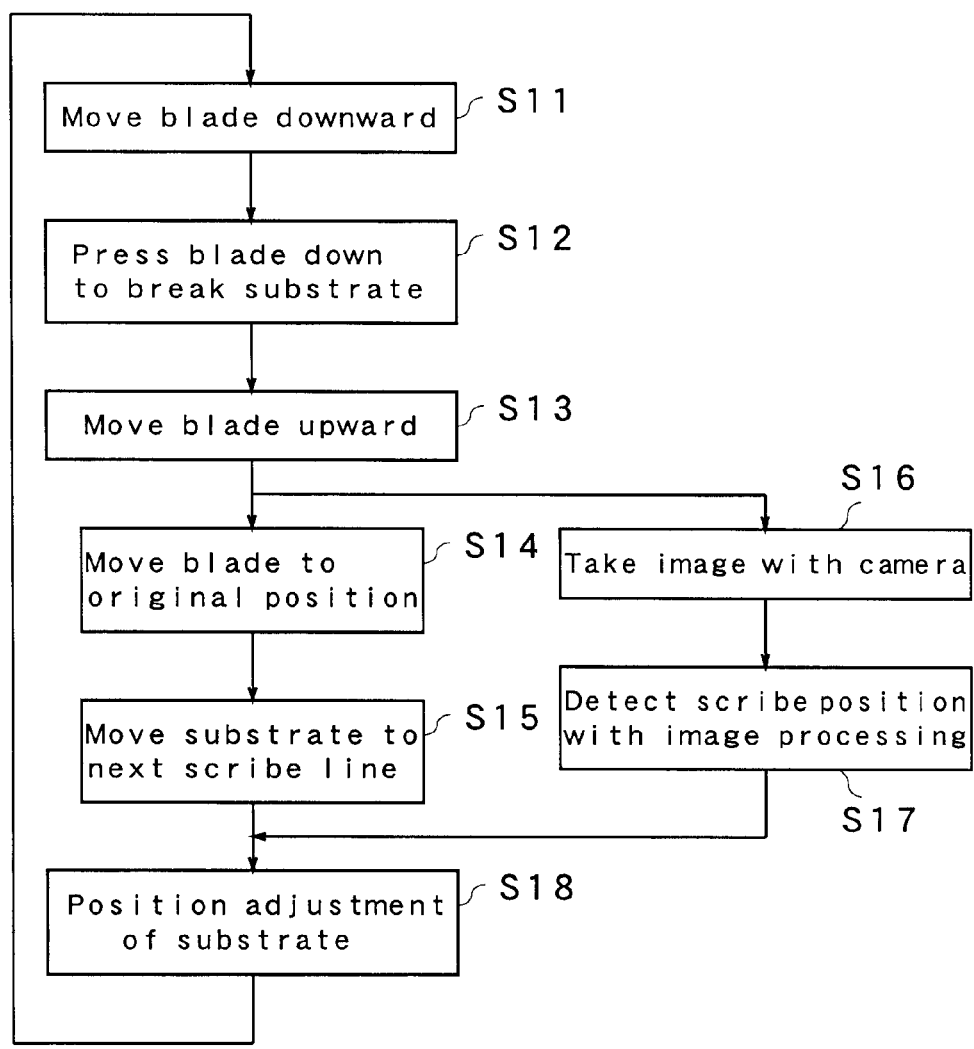
FIG. 9 is a sequence diagram showing the procedural steps of a breaking process in accordance with the first embodiment.
Figure 10:
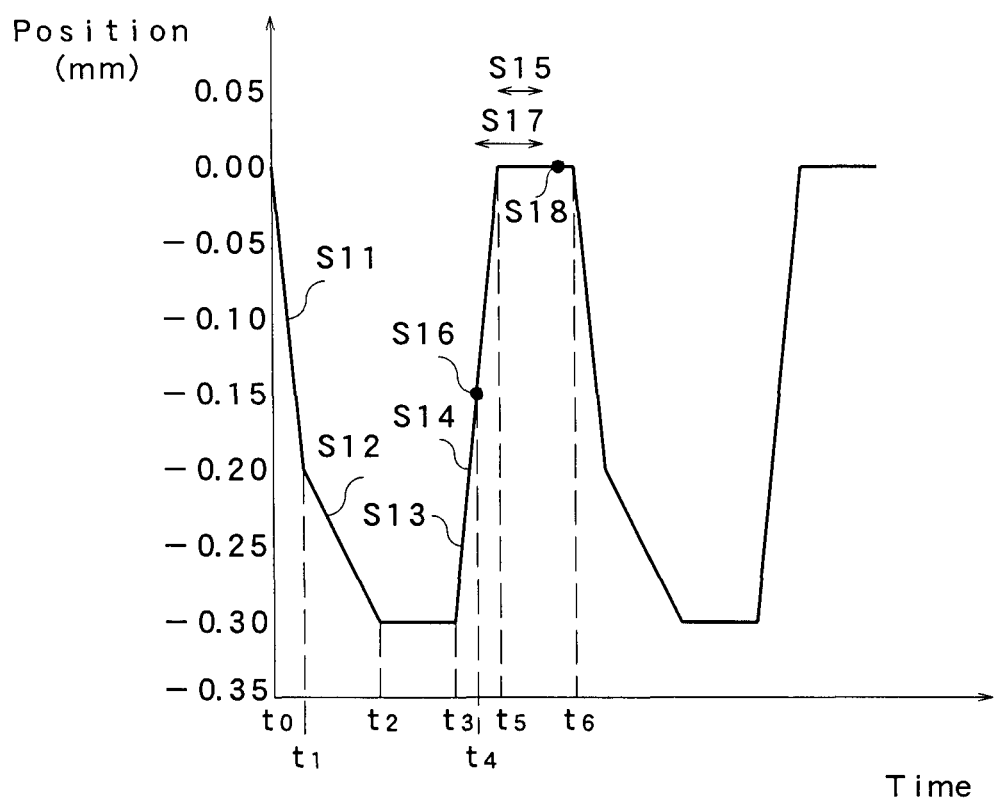
FIG. 10 is a time chart showing the positions of a blade in the direction of a z axis in the breaking process of the first embodiment.

Next, a breaking method for the breaking apparatus in accordance with the first embodiment of the present invention will be described. FIG. 9 is a sequence diagram showing the procedural steps of a breaking process, and FIG. 10 is a time chart showing the positions of the lower end of the blade 23 in the z-axis direction, in which are also shown the step numbers described in FIG. 9. Let it be assumed that the scribe line 54 is situated immediately below the blade 23. Upon breaking being started at a time $t_0$, in step S11 shown in FIG. 9, the blade 23 is moved downward from a position of 0.00 mm. Even after the front end of the blade 23 makes contact with the adhesive film 52 on the top of the substrate at a time $t_1$, the blade 23 is moved further downward while decreasing the rate of downward motion until it reaches a position of −0.30 mm at a time $t_2$, whereupon the substrate 50 is broken. After the completion of breaking, in step S13, the blade 23 is moved upward at a time $t_3$ so as to return to its original position at a time $t_5$ (step S14). As a result, the blade 23 takes up a position of 0.00 mm. Subsequently, in step S15, the substrate 50 is moved in the y-axis direction described in FIG. 7 until the following scribe line is set in position. Given that the distance of travel of the substrate corresponds to the pitch of scribe lines drawn side by side, then the following scribe line is situated substantially immediately below the blade 23 after the travel. However, since the substrate undergoes a small amount of displacement due to the breaking process, it follows that the following scribe line is not exactly situated immediately below the blade 23.

The blade 23 is moved upward at the time $t_3$ and, when the lower end of the blade 23 reaches a position of −0.20 mm and thereabove, the blade 23 is no longer kept in contact with the substrate 50. After the upward movement to this position, at a time $t_4$, an image of the substrate is taken by the camera 35 (step S16). After the image acquisition, in step S17, image processing is performed to detect the position of the following scribe line. That is, in this embodiment, as shown in FIGS. 9 and 10, after the blade is brought out of contact with the substrate 50, the remaining upward movement of the blade and the y-axial movement of the substrate are effected concurrently with the image acquisition and the image processing. After the completion of these process steps, in step S18, the position of the substrate is corrected so that the blade 23 can be situated immediately below the following scribe line. Thus, in this embodiment, since moving action and image processing operation are accomplished in a concurrent manner, it is possible to shorten the time required for the breaking process. After the completion of positional correction, the procedure returns to step S11 at a time $t_6$ to repeat the same process steps.

It is noted that, in this embodiment, an image is taken by the camera after the blade is moved upward to a position where it is no longer kept in contact with the substrate. Alternatively, an image may be taken by the camera after the blade is moved upward to the position that it takes in step S14 shown in FIG. 9. In this case, the movement of the substrate for the placement of the following scribe line is accomplished concurrently with image acquisition and image processing.

Next, the breaking apparatus in accordance with second to fourth embodiments of the present invention will be described. This breaking apparatus is similar in structure to the foregoing breaking apparatus shown in FIGS. 4 to 7. In this breaking apparatus, the camera is driven to move in the x-axis direction.

Figure 11:
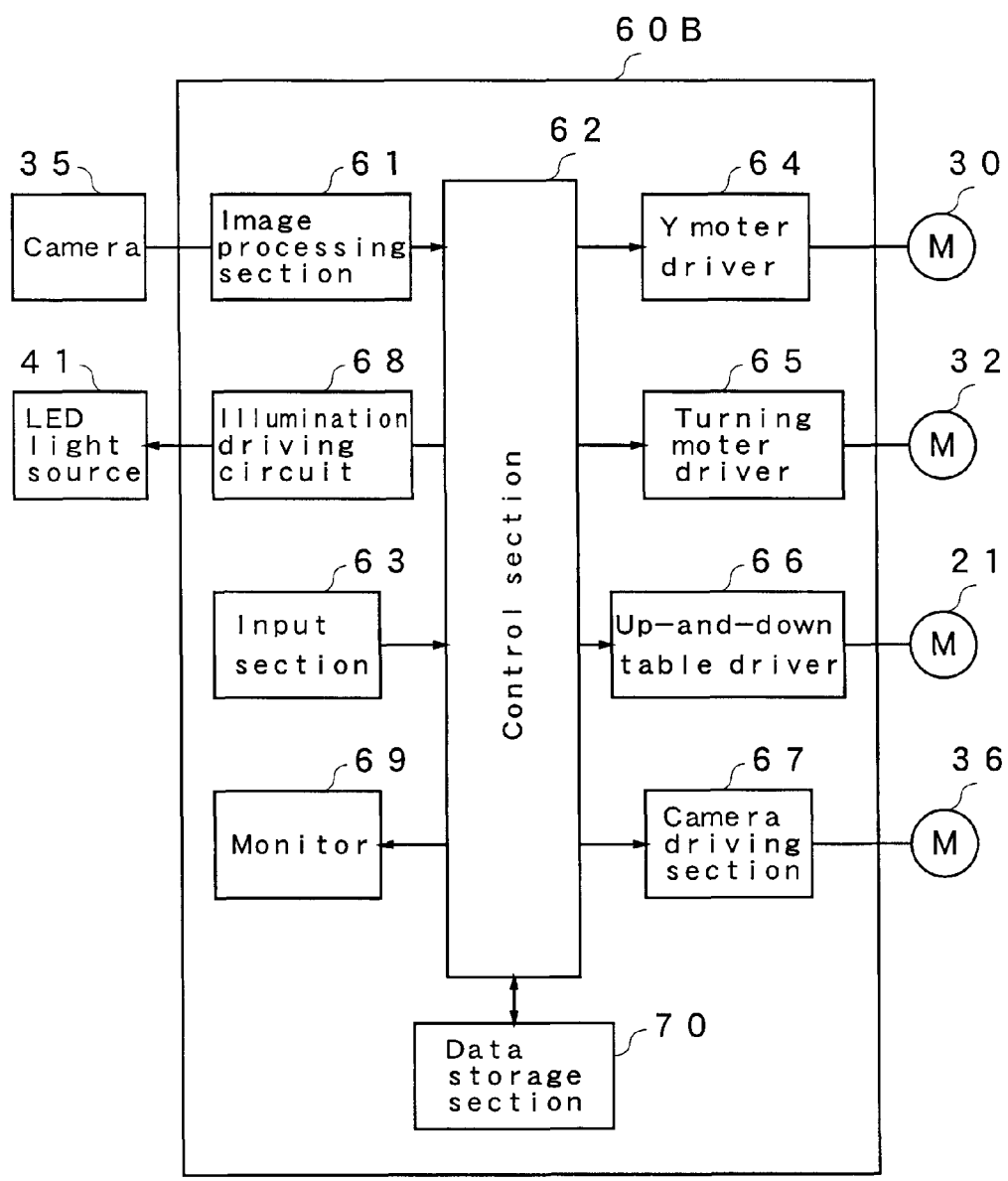
FIG. 11 is a block diagram of a controller in accordance with a second to fourth embodiments of the present invention.

Next, a controller of the breaking apparatus in accordance with the second to fourth embodiments of the present invention will be described. FIG. 11 is a block diagram showing the configuration of a controller 60B of the breaking apparatus. In the figure, an output from the camera 35 is fed, through an image processing section 61 of the controller 60B, to a control section 62. An input section 63 is provided for input of a reference pitch for a brittle material-made substrate. The control section 62 is connected with a Y motor driver 64, a turning motor driver 65, and an up-and-down table driver 66. The Y motor driver 64 drives the stepper motor 30. The turning motor driver 65 drives the motor 32. A camera driver 67 drives the stepper motor 36. On the basis of data such as the pitch of scribe lines, the control section 62 controls the position of the Y table 14 in the y-axis direction and exercises rotation control over the turning table 15. Moreover, the control section 62 effects control of the up-and-down table driver 66 in a manner to adjust the operation of the stepper motor 21. Further, the control section 62 effects control of the camera driver 67 in a manner to drive the camera 35 to move in the x-axis direction. In this way, the up-and-down table 19 is allowed to move up and down in the z-axis direction. Upon the downward movement of the up-and-down table 19, the blade 23 is brought into pressure-contact with a scribe line of the substrate 50. Further, the control section 62 is provided with an illumination driving circuit 68 which is connected to the LED light source 41. The illumination driving circuit 68 drives the LED light source 41 in accordance with a predetermined operation timing, whereby the LED light source 41 can be used as a light source for the camera 35. The illumination driving circuit 68 constitutes an illuminating device in conjunction with the LED light source 41. In addition, the control section 62 is connected with a monitor 69 and a data storage section 70. The data storage section 70 stores therein data including the number of scribe lines.

Figure 12:
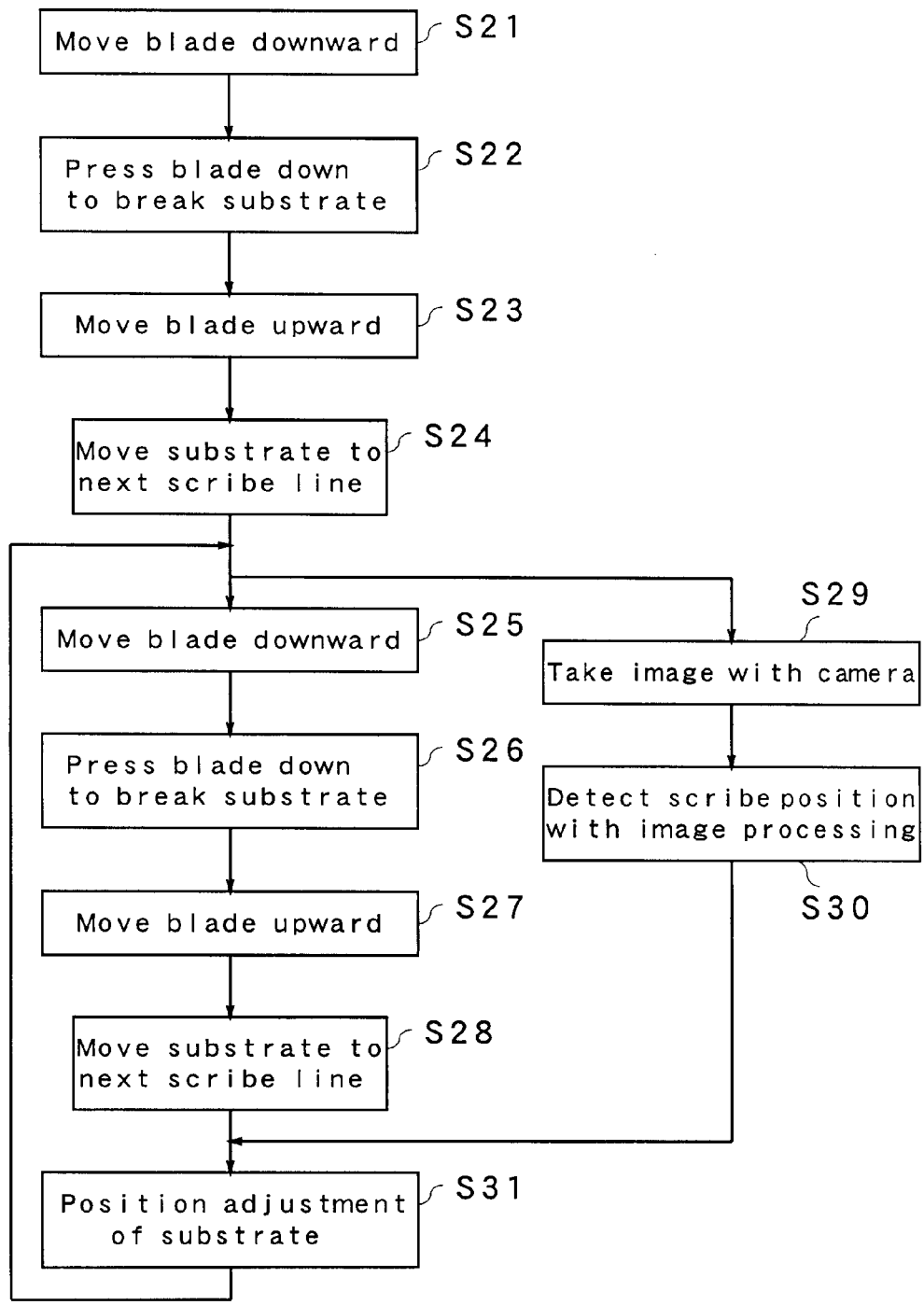
FIG. 12 is a sequence diagram showing the procedural steps of a breaking process in accordance with the second embodiment of the present invention.
Figure 13:
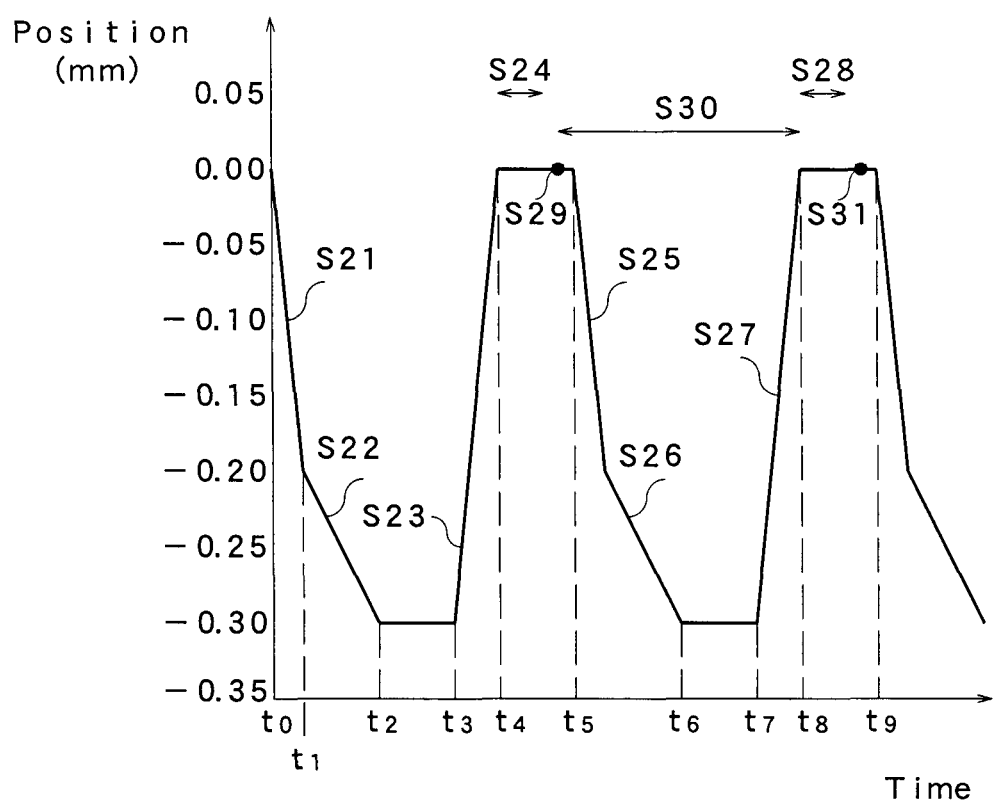
FIG. 13 is a time chart showing the positions of a blade in the z-axis direction in the breaking process of the third embodiment.

Next, a breaking method for the breaking apparatus in accordance with the second embodiment of the present invention will be described. FIG. 12 is a sequence diagram showing the procedural steps of a breaking process, and FIG. 13 is a time chart showing the positions of the lower end of the blade 23 in the z-axis direction, in which are also shown the step numbers described in FIG. 12. Let it be assumed that the scribe line 54 is situated immediately below the blade 23. Upon breaking being started at a time $t_0$, in step S21 shown in FIG. 12, the blade 23 is moved downward from a position of 0.00 mm. Even after the front end of the blade 23 makes contact with the adhesive film 42 on the top of the substrate at a time $t_1$, the blade 23 is moved further downward while decreasing the rate of downward motion until it reaches a position of −0.30 mm at a time $t_2$, whereupon the substrate 50 is broken. After the completion of breaking, in step S23, the blade 23 is moved upward at a time $t_3$ so as to return to its original position at a time $t_4$. As a result, the blade 23 takes up a position of 0.00 mm. Subsequently, in step S24, the substrate 50 is moved in the y-axis direction described in FIG. 7 until the following scribe line is set in position. Given that the distance of travel of the substrate corresponds to the pitch of scribe lines drawn side by side, then the following scribe line is situated substantially immediately below the blade 23 after the travel. As employed herein, a sequence of operations in steps S21 through S24 will be referred to as "the first breaking process".

Next, in step S25, the blade 23 is moved downward at a time $t_5$. Then, even after the front end of the blade 23 makes contact with the adhesive film 52 on the top of the substrate, the blade 23 is pressed further downward while decreasing the rate of downward motion until it reaches a position of −0.30 mm at a time $t_6$, whereupon the substrate 50 is broken (step S26). After the completion of breaking, the blade 23 is moved upward at a time $t_7$ in step S27 so as to return to its original position at a time $t_8$. As a result, the blade 23 takes up a position of 0.00 mm. Subsequently, in step S28, the substrate 50 is moved in the y-axis direction shown in FIG. 7 until the following scribe line is set in position. Given that the distance of travel of the substrate corresponds to the pitch of scribe lines drawn side by side, then the following scribe line is situated substantially immediately below the blade 23 after the travel. However, since the substrate undergoes a small amount of displacement due to the breaking process, it follows that the following scribe line is not exactly situated immediately below the blade 23. As employed herein, a sequence of operations in steps S25 through S28 will be referred to as "the second breaking process".

Now, a description will be given below as to a concurrent operation which is executed concurrently with the second breaking process. To begin with, an image is taken by the camera 35 immediately before the time $t_5$ (step S29). After the completion of image acquisition, in step S30, image processing is performed to detect the position of the following scribe line, with the addition of an increment equal to 1 pitch of scribe lines. That is, in this embodiment, as shown in FIGS. 12 and 13, the up-and-down movement of the blade and the y-axial movement of the substrate 50 are accomplished concurrently with image acquisition and image processing. After the completion of these process steps, in step S31, the position of the substrate is corrected so that the blade 23 is situated immediately below the following scribe line. After the completion of this positional correction, the procedure returns to step S25 to repeat the same process steps at a time $t_9$.

By doing so, although the position of the substrate cannot be corrected in the first breaking process (S21 through S25), in the subsequent second breaking process and from then on, the correction of substrate position can be achieved on the basis of the data on the scribe line obtained by the image processing in the previous one operation cycle. Thus, in this embodiment, since the up-and-down movement of the blade and the substrate movement are accomplished concurrently with image processing, it is possible to shorten the time required for the breaking process.

Figure 14B:
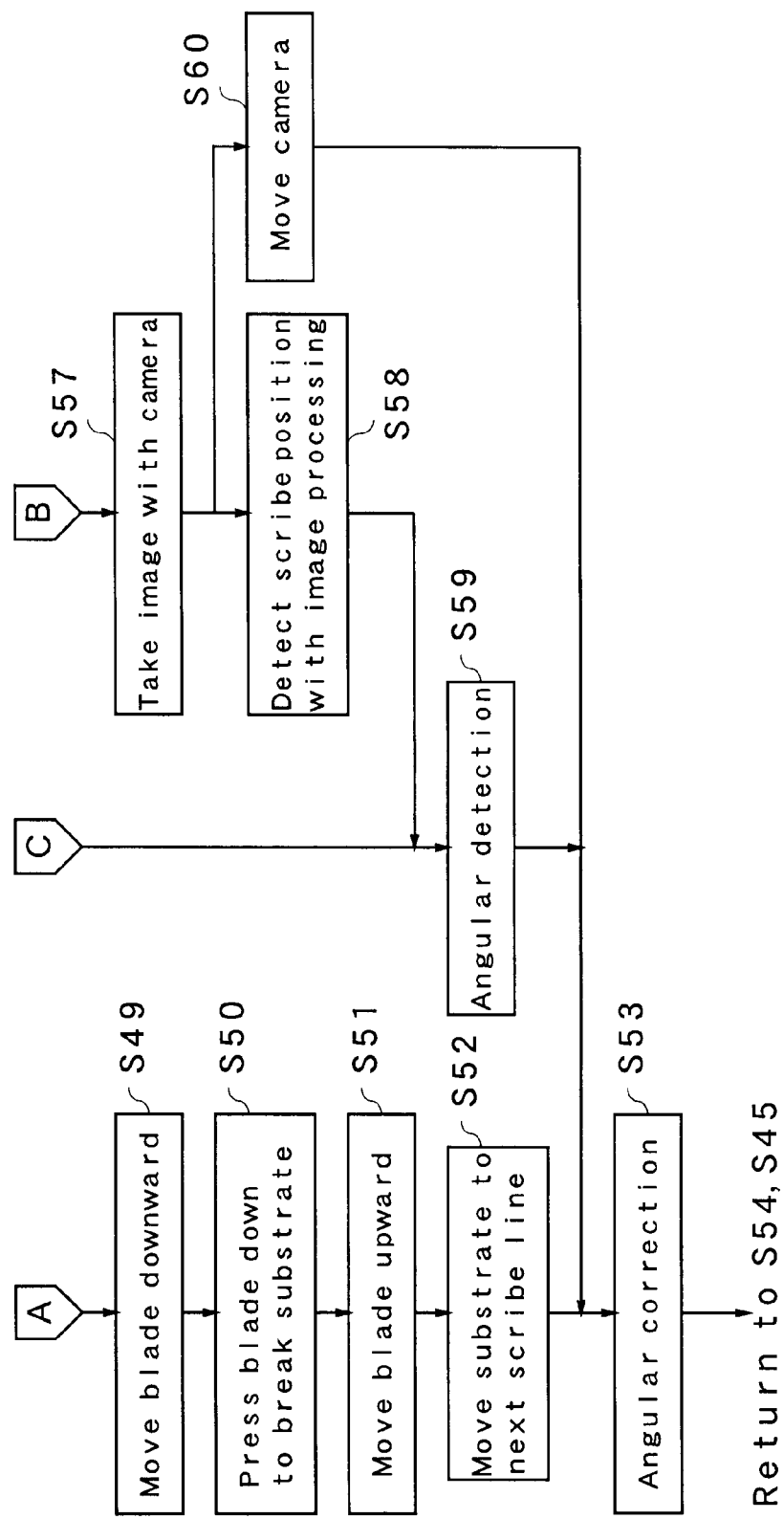
FIG. 14B is a sequence diagram showing the procedural steps of the breaking process of the third embodiment of the present invention (the second sequence)
Figure 15:
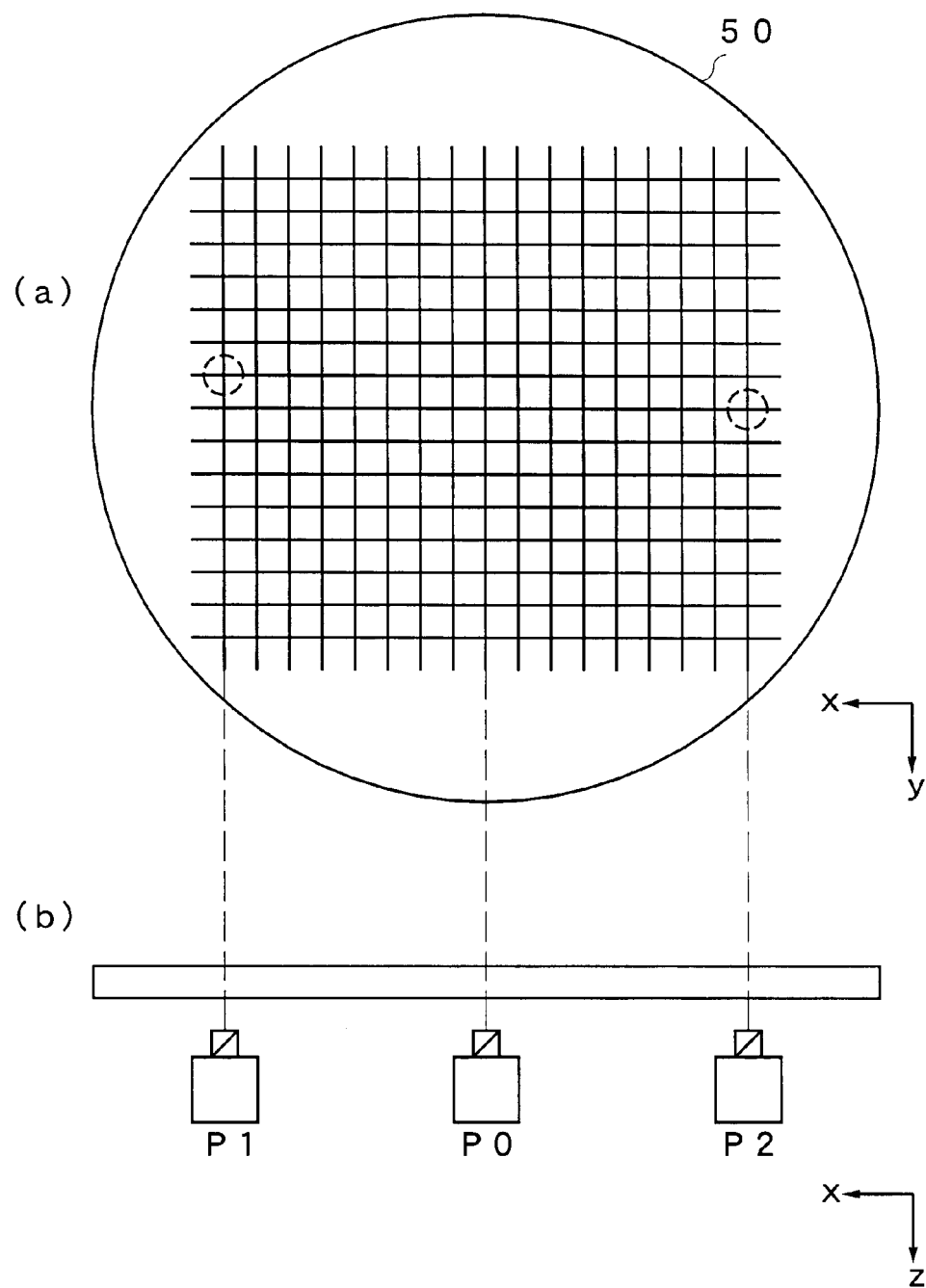
FIG. 15 is a view showing the top and a lateral face of a substrate in the breaking process of the third embodiment.

Next, the third embodiment of the present invention will be described. In this embodiment, the substrate is not subjected to positional correction in the pitch direction but is subjected to angular correction instead. In terms of the structure of the breaking apparatus in itself and the controller, the third embodiment is configured identically with the second embodiment, wherefore the description about that will be omitted. FIGS. 14A and 14B are sequence diagrams showing the procedural steps in a breaking process in accordance with this embodiment, and FIG. 15 is a view showing the upper surface of the substrate, the positions of scribe lines, and image-taking positions for the camera. Upon breaking being started, just as the first breaking process of the second embodiment, in steps S41 through S44 as shown in FIG. 14A, the downward movement of the blade 23, the breaking of the substrate 50, the upward movement of the blade 23, and the movement of the substrate to the placement of the following scribe line are accomplished (the first breaking process).

Then, just as the second breaking process of the second embodiment, in steps S45 through S48, the downward movement of the blade 23, the breaking of the substrate 50, the upward movement of the blade 23, and the movement of the substrate to the placement of the following scribe line are accomplished (the second breaking process). In addition, in this embodiment, by way of the third breaking process, in steps S49 through S52, the downward movement of the blade 23, the upward movement of the blade 23, and the movement of the substrate 50 are accomplished. Given that the distance of travel of the substrate in steps S44, S48, and S52 corresponds to the pitch of scribe lines drawn side by side, then the following scribe line is situated substantially immediately below the blade 23 after the travel. However, since the substrate undergoes a small amount of displacement due to the breaking process, it follows that the following scribe line is not exactly situated immediately below the blade 23.

Now, a description will be given below as to a concurrent operation which is executed concurrently with the second and third breaking processes. To begin with, given that the camera is set in a position P1 as shown in FIG. 15, an image is taken by the camera 35 immediately before the downward movement of the blade in step S45 (step S54). In FIG. 15, the position P1 is defined as the leftmost position to which the camera 35 is allowed to move on the x axis. When in the position P1, the camera takes an image of a far-left portion of the substrate indicated by a broken line in FIG. 15. After the image acquisition, image processing is performed in step S55 to detect the position of the following scribe line. Moreover, in parallel with the process of position detection, in step S56, the camera is moved to a position P2 as shown in FIG. 15. In FIG. 15, the position P2 is defined as the rightmost position to which the camera 35 is allowed to move. After the completion of camera movement, the substrate 50 is moved for the placement of the following scribe line in step S48, whereafter the procedure proceeds to step S57 where an image is taken by the camera once again. Then, image processing is performed in step S58 to detect the position of the following scribe line.

After the completion of position detection, the procedure proceeds to step S59 where angular detection is performed. In the process of angular detection, on the basis of the scribe line positions obtained through two image processing tasks in step S55 and step S59, respectively, angular change of the image is detected. There is a difference equal to 1 pitch between step S55 and step S59. Therefore, under the condition where an increment of predetermined 1 pitch is imparted to the position detected by the image processing in step S55, a comparison is made between the position obtained in step S55 and the position obtained in step 59 to detect angular deviation. Then, in step S53, the motor 32 is driven to run by the turning motor driver 65, thereby correcting the variation in turning angle of the substrate. Moreover, in parallel with the scribe line position detection and the angular detection in step S58 and step S59, in step S60, the camera is moved to a position to take the following image. In the case of performing angular correction repeatedly, the camera is moved to the rightmost position P1 in the x-axis direction, whereas in the case of performing delay concurrent processing, the camera is moved to the central position P0. After the completion of angular correction in step S53, the procedure returns to step S54, as well as step S45, to repeat the same process steps.

In this embodiment, as shown in FIGS. 14A, 14B and 15, the movement of the substrate 50 in the x-axis direction is accomplished concurrently with image acquisition and image processing. Although in this embodiment, angular correction cannot be achieved in the first breaking cycle, from then on, angular correction can be achieved at every two cycles. Thus, in this embodiment, since moving operation and image processing are performed concurrently, it is possible to shorten the time required for the breaking process.

Figure 16:
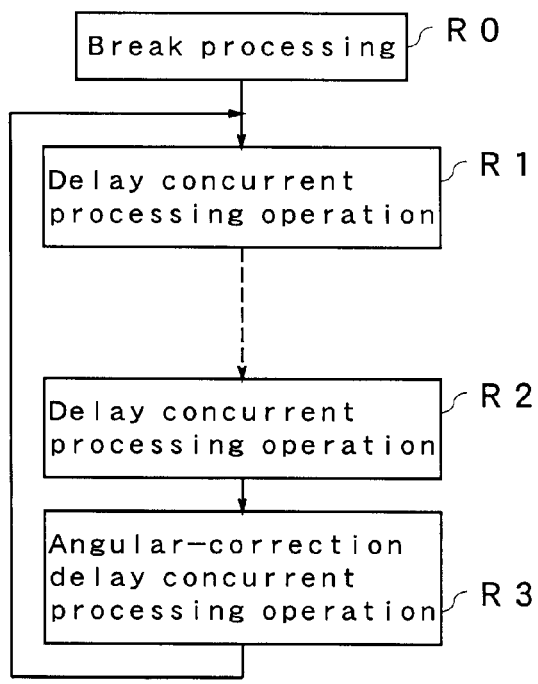
FIG. 16 is a sequence diagram showing the procedural steps of a breaking process in accordance with the fourth embodiment of the present invention.

Next, the fourth embodiment of the present invention will be described. In this embodiment, the delay concurrent processing operation of the second embodiment and the angular-correction delay concurrent processing operation of the third embodiment are performed in conjunction with each other. In FIG. 16, Routine R0 corresponds to the abovementioned operations in steps S21 through S24 shown in FIG. 12, and Routine R1 corresponds to the delay concurrent processing operations in steps S25 through S31. Routine R1 and Routine R2 are indicative of repetition of the delay concurrent processing operations in steps S25 through S31, and the number of repetitions is set at two in this embodiment. Then, as indicated by Routine R3, the process of angular correction is performed. The angular correction is performed in conformity with a series of operations in steps S45 through S60 described previously by way of the third embodiment referring to FIGS. 14A and 14B. After the completion of this process, the procedure returns to Routine R1 to repeat the delay concurrent operation.

Figure 17:
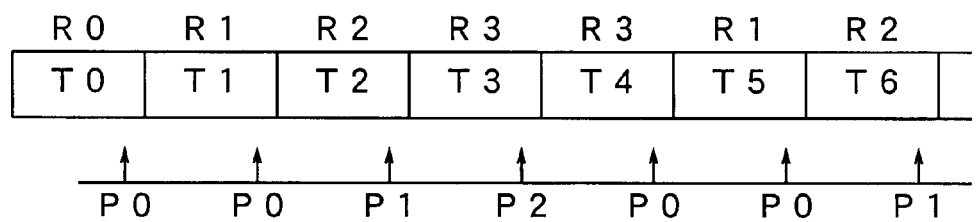
FIG. 17 is a view showing a time chart for the breaking process of the fourth embodiment of the present invention and corresponding camera positions.

FIG. 17 is a view showing a time sequence of the operation. Ti (i is a natural number) represents a cycle of breaking. In breaking cycles T0, T1, and T2, the breaking process (R0) and the delay concurrent processing operation (R1 and R2) are performed. In FIG. 17, there is shown a circumstance where the image data obtained by the camera 35 situated at the central position P0 shown in FIG. 15 substantially at the conclusion of the cycle T0, T1 is used for the correction of substrate position in the following cycle. In the following cycles, more specifically, in the cycle T2, the camera is placed in the position P1, and in the cycle T3, the camera is placed in the position P2. In the cycles T3 and T4, the angular-correction delay concurrent processing operation (Routine R3) is executed. Then, in the cycle T4, angular positional adjustment is performed. At a time toward the end of the cycle T4, the camera is moved to the central position P0 once again, and positional correction is performed in the cycle T5. In this way, by adding 2-cycle correction as angular adjustment, angular correction and adjustment to pitch position can be achieved at the same time. Angular correction is less likely to involve occurrence of errors than is pitch-position adjustment. It is therefore possible to add one angular adjustment process after the delay concurrent processing operation is repeated a plurality of times, for example, 5 to 20 times.

It is noted that, while the foregoing description of each embodiment deals with the breaking process for a motherboard constructed by forming LED chips on a sapphire substrate, a substrate subjected to the breaking process is not limited to a sapphire substrate but may be of, for example, a super-hard substrate such as a diamond substrate or a brittle material-made substrate such as a silicon single crystal substrate, a silicon carbide substrate, and a magnetized aluminum substrate. Moreover, the present invention is applicable to a breaking process for various brittle material-made substrates, such as a breaking process for a silicon substrate including LED or memory, a breaking process for a GaN substrate used for a laser, a radio-frequency device, or the like, and a breaking process for a SiC substrate used for power transistor.

Where image acquisition by the camera is concerned, in each of the embodiments, as shown in FIG. 7, light is applied from under the substrate 50, and part of the light is reflected from the half mirror 40 to illuminate a scribe line from below. That is, an image is obtained by means of reflection-mode illumination. However, another method may be adopted instead so long as it allows image acquisition within a short period of time. For example, a light source such as LED may be placed immediately below the substrate 50. In this case, light which has been transmitted through the substrate 50 is received for illumination. That is, an image is obtained by means of transmission-mode illumination. Moreover, while the embodiments employ a bright-field illumination technique to take an image in a coaxial condition where the axis of the camera coincides with the optical axis of illumination light, it is possible to employ instead a dark-field illumination technique to take an image in a non coaxial condition where light from a light source placed obliquely upward or downward of the substrate is applied to the substrate.

Further, in each of the foregoing embodiments, LED is used for illumination. Alternatively, a flash lamp is turned on momentarily during the interval when a CCD camera is standing ready to take an image, so that an image can be obtained at the moment of light emission. This makes it possible to take an image at high speed, as well as to determine substrate position with high accuracy.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese application No. 2010-105372 filed on Apr. 30, 2010 and the text of Japanese application No. 2010-105373 filed on Apr. 30, 2010 are hereby incorporated by reference.

What is claimed is:

1. A breaking method for breaking a substrate formed with a plurality of scribe lines successively along the scribe lines by pressing a blade thereto, comprising the steps of:
   a first breaking process of lowering and raising a blade in line with a scribe line to break a substrate along the scribe line, and moving said substrate so that the following scribe line to be cut for breaking can be situated immediately below said blade;
   a second breaking process of lowering and raising the blade in line with the scribe line to break the substrate along the scribe line, and moving said substrate so that the following scribe line to be cut for breaking can be situated immediately below said blade;

a third breaking process of lowering and raising the blade in line with the scribe line to break the substrate along the scribe line, and moving said substrate so that the following scribe line to be cut for breaking can be situated immediately below said blade;

a first image processing for, after the completion of said first breaking process, acquiring an image of the substrate with use of a camera to detect the position of the following scribe line to be cut for breaking concurrently with said second breaking process;

a second image processing for, after the completion of said second breaking process, acquiring an image of the substrate with use of the camera in a different position to detect the position of the following scribe line to be cut for breaking concurrently with said third breaking process; and a process of, after the completion of said third breaking process, correcting the position of said substrate so that the following scribe line to be cut for breaking can be situated immediately below said blade on the basis of the position detected by said first image processing and second image processing, whereafter returning the procedure to said second breaking process.

2. The breaking method according to claim 1, wherein said first, second and third breaking processes comprise:
a step of lowering the blade in line with a scribe line,
a step of pressing said blade down to break the substrate along the scribe line formed thereon,
a step of raising said blade, and
a step of moving the substrate until the following scribe line to be cut for breaking is set in a breaking position.

3. A breaking apparatus for breaking a substrate formed with a plurality of scribe lines successively along the scribe lines, comprising:
a blade raising-lowering unit for moving a blade in upward and downward directions to break a substrate;
a blade rest for holding a substrate formed with a plurality of scribe lines;
a moving unit for moving and rotating said substrate along its surface;
a camera for taking an image of part of the substrate located between said blade rest; and
a controller for performing a first breaking process of lowering and raising a blade in line with a scribe line to break a substrate along the scribe line, and moving said substrate so that the following scribe line to be cut for breaking can be situated immediately below said blade; a second breaking process of lowering and raising the blade in line with the scribe line to break the substrate along the scribe line, and moving said substrate so that the following scribe line to be cut for breaking can be situated immediately below said blade; a third breaking process of lowering and raising the blade in line with the scribe line to break the substrate along the scribe line, and moving said substrate so that the following scribe line to be cut for breaking can be situated immediately below said blade; a first image processing for, after the completion of said first breaking process, acquiring an image of the substrate with use of a camera to detect the position of the following scribe line to be cut for breaking concurrently with said second breaking process; a second image processing for, after the completion of said second breaking process, acquiring an image of the substrate with use of the camera in a different position to detect the position of the following scribe line to be cut for breaking concurrently with said third breaking process; and a process of, after the completion of said third breaking process, correcting the position of said substrate so that the following scribe line to be cut for breaking can be situated immediately below said blade on the basis of the position detected by said first image processing and second image processing.

4. The breaking apparatus according to claim 3, further comprising:
an illuminating device for illuminating the substrate at the time of image acquisition using said camera.

5. The breaking apparatus according to claim 4, wherein said illuminating device comprises a light source for emitting light of single color.

6. The breaking apparatus according to claim 4, wherein said illuminating device is configured to apply light to the substrate by means of one of transmission-mode illumination and reflection-mode illumination.

7. The breaking apparatus according to claim 4, wherein said illuminating device employs one of a bright-field illumination technique for effecting illumination in coaxial relation to image-taking action of the camera and a dark-field illumination technique for effecting illumination in non coaxial relation thereto.

* * * * *